United States Patent
Luo et al.

(10) Patent No.: US 10,531,585 B2
(45) Date of Patent: Jan. 7, 2020

(54) MECHANISM FOR LOCKING AND UNLOCKING PHOTOELECTRIC MODULE

(71) Applicant: WUHAN TELECOMMUNICATION DEVICES CO., LTD., Wuhan (CN)

(72) Inventors: Yaoxin Luo, Wuhan (CN); Benqing Quan, Wuhan (CN); Beili Song, Wuhan (CN); Yi Jiang, Wuhan (CN)

(73) Assignee: WUHAN TELECOMMUNICATION DEVICES CO., LTD., Hubei (CN)

( * ) Notice: Subject to any disclaimer, the term of this patent is extended or adjusted under 35 U.S.C. 154(b) by 276 days.

(21) Appl. No.: 15/533,044

(22) PCT Filed: Dec. 18, 2014

(86) PCT No.: PCT/CN2014/094187
§ 371 (c)(1),
(2) Date: Jun. 5, 2017

(87) PCT Pub. No.: WO2016/086464
PCT Pub. Date: Jun. 9, 2016

(65) Prior Publication Data
US 2019/0090370 A1    Mar. 21, 2019

(30) Foreign Application Priority Data
Dec. 4, 2014  (CN) .......................... 2014 1 0730379

(51) Int. Cl.
*H05K 5/02*      (2006.01)
*G02B 6/42*      (2006.01)
(Continued)

(52) U.S. Cl.
CPC ............. *H05K 5/0221* (2013.01); *G02B 6/42* (2013.01); *G02B 6/4201* (2013.01);
(Continued)

(58) Field of Classification Search
CPC .. G02B 6/4292; G02B 6/4261; G02B 6/4246; G02B 6/4284; G02B 6/4201;
(Continued)

(56) References Cited

U.S. PATENT DOCUMENTS

2004/0161958 A1 *  8/2004  Togami ................ G02B 6/4246
                                                            439/160
2005/0018976 A1    1/2005  Lee et al.
2013/0071072 A1 *  3/2013  Xie ..................... G02B 6/4277
                                                            385/92

FOREIGN PATENT DOCUMENTS

CN        2864720        1/2007
CN        101614850      12/2009
(Continued)

*Primary Examiner* — James Wu
(74) *Attorney, Agent, or Firm* — Adam W. Bell; Matthew R. Kaser

(57) ABSTRACT

A mechanism for locking and unlocking a photoelectric module, comprising: a base, and a handle, a clipping cover (3), a lock latch (4) and a hood placed above the base—the base is provided with a cuboid-shaped lock latch limiting slot and two sides of the lock latch limiting slot latch turning slots (1-3); an upper end on a left side face of the base (1) is provided with a handle turning slot a left end of the lock latch is a handle fitting position (4-1), an upper bottom face of a right end of the lock latch is provided with a tab (4-3), and lock latch rotation shafts (4-2) are provided between the handle fitting position and the tab solves the problems of restricted internal room of the tube shell and complicated tube shell installation procedure.

8 Claims, 9 Drawing Sheets

(51) Int. Cl.
| | |
|---|---|
| *H04B 10/00* | (2013.01) |
| *H05K 5/03* | (2006.01) |
| *H05K 7/14* | (2006.01) |
| *H05K 9/00* | (2006.01) |
| *H01R 13/627* | (2006.01) |

(52) U.S. Cl.
CPC ......... *G02B 6/4261* (2013.01); *G02B 6/4292* (2013.01); *H04B 10/00* (2013.01); *H05K 5/023* (2013.01); *H05K 5/0239* (2013.01); *H05K 5/03* (2013.01); *H05K 7/1427* (2013.01); *H05K 9/0058* (2013.01); *G02B 6/4246* (2013.01); *G02B 6/4277* (2013.01); *H01R 13/6272* (2013.01)

(58) Field of Classification Search
CPC .... G02B 6/4277; G02B 6/42; H01R 13/6275; H01R 13/6335; H01R 13/62933; H01R 13/6272; H04B 10/00; H05K 5/0221
See application file for complete search history.

(56) References Cited

FOREIGN PATENT DOCUMENTS

| | | |
|---|---|---|
| CN | 201740891 | 2/2011 |
| CN | 204314511 | 5/2015 |
| JP | 2008090148 | 4/2008 |

\* cited by examiner

MECHANISM FOR LOCKING AND UNLOCKING PHOTOELECTRIC MODULE

TECHNICAL FIELD

The present invention relates to the technical field of modules for photoelectric communication, and particularly to a mechanism for locking and unlocking a photoelectric module.

BACKGROUND ART

The major unlocking methods of current photoelectric modules, the one is meet MSA (Transceiver MultiSource Agreement) (INF8074 Information 8074), wherein the unlocking tab is of the fixed type, and the unlocking is implemented by a retaining piece pushing the clip of a metal shielding cages. The photoelectric modules of that structure, when being put into and being released from some unusual metal shielding cages for photoelectric communication systems, cannot smoothly complete the actions of locking and unlocking. The other mode is to realize the locking and unlocking of the modules with the metal shielding cages of photoelectric communication systems by means of extra tools, which has tedious operations.

Technical Problems

The object of the embodiments of the present invention is to provide a mechanism for locking and unlocking a photoelectric module, to solve the problem of the prior art of the difficulties in putting photoelectric modules into and releasing photoelectric modules from metal shielding cages for photoelectric communication systems.

Technical Solution

The embodiments of the present invention are implemented as follows: a mechanism for locking and unlocking a photoelectric module, wherein, the mechanism comprises: a base 1, and some components which placed above the base 1 and connected to the base 1, including a handle 2, a clipping cover 3, a lock latch 4 and a hood 5 the base 1 is of a cuboid shape with an inner cavity, the left end of the upper bottom face of the base 1 is provided with a cuboid-shaped lock latch limiting slot 1-1, and the two sides in the front and rear of the cuboid-shaped lock latch limiting slot 1-1 on the upper bottom face of the base 1 are provided with two symmetrical lock latch turning slots 1-3;

the upper end on the left side face of the base 1 is provided with a handle turning slot 1-2 whose axial direction is the front-back direction;

the lock latch 4 is an elongated-rod rigid body, wherein the left end of the lock latch 4 is a handle fitting position 4-1, the upper bottom face of the right end of the lock latch 4 is provided with a tab 4-3, and lock latch rotation shafts 4-2 are provided between the handle fitting position 4-1 and the tab 4-3 correspondingly on the front face and the rear face of the lock latch 4;

the left end of the lock latch 4 and the lock latch rotation shafts 4-2 are respectively placed within the lock latch limiting slot 1-1 and the lock latch turning slots 1-3;

the handle 2 is of a cubic frame shape having an opening or closed, and in the upper border frame of the handle 2, the two ends are two symmetrical first rotation shafts 2-3, and the middle is a second rotation shaft 2-4 of a height less than those of the first rotation shafts 2-3; and the first rotation shafts 2-3 and the second rotation shaft 2-4 are respectively placed within the handle turning slot 1-2 and the handle fitting position 4-1;

the clipping cover 3 is of a U-shape, with the opening of the U shape downward, and is provided above the handle 2 and the lock latch 4; and the hood 5 is of a U-shape, with the opening of the U shape downward, the hood 5 is provided to the right of the handle 2, the clipping cover 3 and the lock latch 4, the left end of the upper bottom face of the hood 5 is provided with an unlocking tab hole 5-3, and the size of the unlocking tab hole 5-3 matches the tab 4-3 of the lock latch 4.

In a first preferable embodiment of the mechanism for locking and unlocking a photoelectric module that is provided by the present invention: the upper bottom face of the base 1 is further provided with a protruding shaft whose axial direction is the front-back direction, and the middle of the lock latch 4 is placed on the protruding shaft;

the first rotation shafts 2-3 turn within the handle turning slot 1-2; and the second rotation shaft 2-4 turns in the axial direction of the first rotation shafts 2-3 by the driving of the first rotation shafts 2-3, and slides within the handle fitting position 4-1;

when the first rotation shafts 2-3 and the second rotation shaft 2-4 turn to the position where the handle 2 is parallel to the left and right faces of the base 1 and the handle 2 is fixed to a left head of the base 1, the second rotation shaft 2-4 is located at a vertically lowest position, and drives the handle fitting position 4-1, which is connected thereto, to descend and the right end of the lock latch 4 to ascend, which causes the tab 4-3 to ascend into the unlocking tab hole 5-3, which makes the whole mechanism in a locking state; and when the first rotation shafts 2-3 and the second rotation shaft 2-4 turn to the position where the plane where the handle 2 is located is adjacent to the upper bottom face of the base 1, the second rotation shaft 2-4 is located at a vertically highest position, and drives the handle fitting position 4-1, which is connected thereto, to ascend and the right end of the lock latch 4 to descend, which causes the tab 4-3 to descend to be below the unlocking tab hole 5-3, which makes the whole mechanism in an unlocking state.

In a second preferable embodiment of the mechanism for locking and unlocking a photoelectric module that is provided by the present invention: both of the front face and the rear face of the base 1 are provided with a hood position clipping tab 1-11 and a first clipping cover position clipping tab 1-12; the numbers of the hood position clipping tab 1-11 and the first clipping cover position clipping tab 1-12 are both at least a pair, which are provided in the front face and the rear face of the base 1 correspondingly in pairs; and a pair of handle turning slots 1-2 at the upper end of the left side face of the base 1 extend outwardly to form a pair of symmetrical second clipping cover position clipping tabs 1-13;

the front face and the rear face of the clipping cover 3 are correspondingly provided with at least a pair of first position clipping square holes 3-2, the first position clipping square holes 3-2 are clipped to the first clipping cover position clipping tab 1-12 of the base 1; and the left side face of the clipping cover 3 is provided with a pair of second position clipping square holes 3-3 that are provided correspondingly to the second clipping cover position clipping tabs 1-13, and the second position clipping square holes 3-3 are clipped to the second clipping cover position clipping tabs 1-13;

after the lock latch 4 and the handle 2 are fixedly connected to the base 1, the clipping cover 3 is placed at the upper parts of the lock latch 4 and the handle 2 and is fixed to the base 1 by the first position clipping square holes 3-2 and the second position clipping square holes 3-3; and the front face and the rear face of the hood 5 are correspondingly provided with at least a pair of third position clipping square holes 5-1, and the third position clipping square holes 5-1 are clipped to the hood position clipping tab 1-11 of the base 1 to realize the fixing between the hood 5 and the base 1.

In a third preferable embodiment of the mechanism for locking and unlocking a photoelectric module that is provided by the present invention: the middle of the lower bottom face of the base 1 is provided with an EMI clip 1-5, the right side is a main tag slot 1-9, and the left side is provided with RJ45 clipping ears 1-6 that are provided correspondingly in the front-back direction; and the middle of the upper bottom face is provided with an EMI shielding sheet 1-4, and the right side is a PCB board 1-8;

the lower end of the left side face of the base 1 is provided with a pair of protruding handle clipping ears 1-7, which are used for, when the first rotation shafts 2-3 and the second rotation shaft 2-4 turn to the position where the handle 2 is parallel to the left and right faces of the base 1 and the handle 2 is fixed to the left head of the base 1, fixing the handle 2; and the lower end of the right side face of the base 1 is provided with an anti-reverse-insertion notch 1-10.

In a fourth preferable embodiment of the mechanism for locking and unlocking a photoelectric module that is provided by the present invention: the handle fitting position 4-1 is of an opening U shape or a closed elliptical ring shape, and the tab 4-3 is a triangular or square tab.

In a fifth preferable embodiment of the mechanism for locking and unlocking a photoelectric module that is provided by the present invention: the handle 2 further comprises an opening or closed type handle main body 2-1 and handle sheath 2-2 that are made from a rigid or semi-rigid material, the first rotation shafts 2-3, the second rotation shaft 2-4 and the handle sheath 2-2 are all provided on the outside of the handle main body 2-1, and the handle sheath 2-2 are located at the two ends of the opening of the opening type handle main body 2-1.

In a sixth preferable embodiment of the mechanism for locking and unlocking a photoelectric module that is provided by the present invention: the upper bottom face, the left end and the middle of the clipping cover 3 are all provided with a window 3-1, rotation shaft clamping lugs 3-4 are provided below the two sides of the windows 3-1 whose axial directions are the left-right direction, and the rotation shaft clamping lugs 3-4 conduct limiting clipping to the first rotation shafts 2-3 of the handle 2 and the lock latch rotation shafts 4-2 of the lock latch 4 and the handle turning slots 1-2 and the lock latch turning slots 1-3 of the base 1.

In a seventh preferable embodiment of the mechanism for locking and unlocking a photoelectric module that is provided by the present invention: both of the left ends of the front face and the rear face of the clipping cover 3 are provided with edge folds 3-5 that are formed by bending the upper bottom face, and in the process of turning the handle 2 to move the mechanism from the locking state to the unlocking state, the handle 2 approaches the edge fold 3-5 and is stopped, which enables the turning of the handle 2 not to exceed a preset turning angle.

In an eighth preferable embodiment of the mechanism for locking and unlocking a photoelectric module that is provided by the present invention: both of the front face and the rear face of the left end of the hood 5 are provided with an EMI sprung claw 5-2, and the right end of the upper bottom face of the hood 5 is bent obliquely downwardly to form an EMI bent 5-5; and the front face or the rear face of the hood 5 is further provided with a side tag slot 5-4.

Advantageous Effects

The advantageous effects of the mechanism for locking and unlocking a photoelectric module that is provided by an embodiment of the present invention include:

The mechanism for locking and unlocking a photoelectric module that is provided by an embodiment of the present invention has an exquisite structural design, by which the profile of the module meets the requirements on the size by MSA, and additionally the problems of restricted internal room of the tube shell and complicated tube shell installation procedure are solved. Additionally, the actions of the locking and unlocking of the module in metal shielding cages of photoelectric communication systems can be realized conveniently and quickly. The locking and unlocking mechanism of the present invention can be conveniently and flexibly assembled and disassembled.

BRIEF DESCRIPTION OF THE DRAWINGS

In order to more clearly illustrate the technical solutions in the embodiments of the present invention, the figures that are required to describe the embodiments or the prior art will be briefly introduced below. Apparently, the figures that are described below are merely embodiments of the present invention, and a person skilled in the art can obtain other figures according to these figures without paying creative work.

Figure 1:
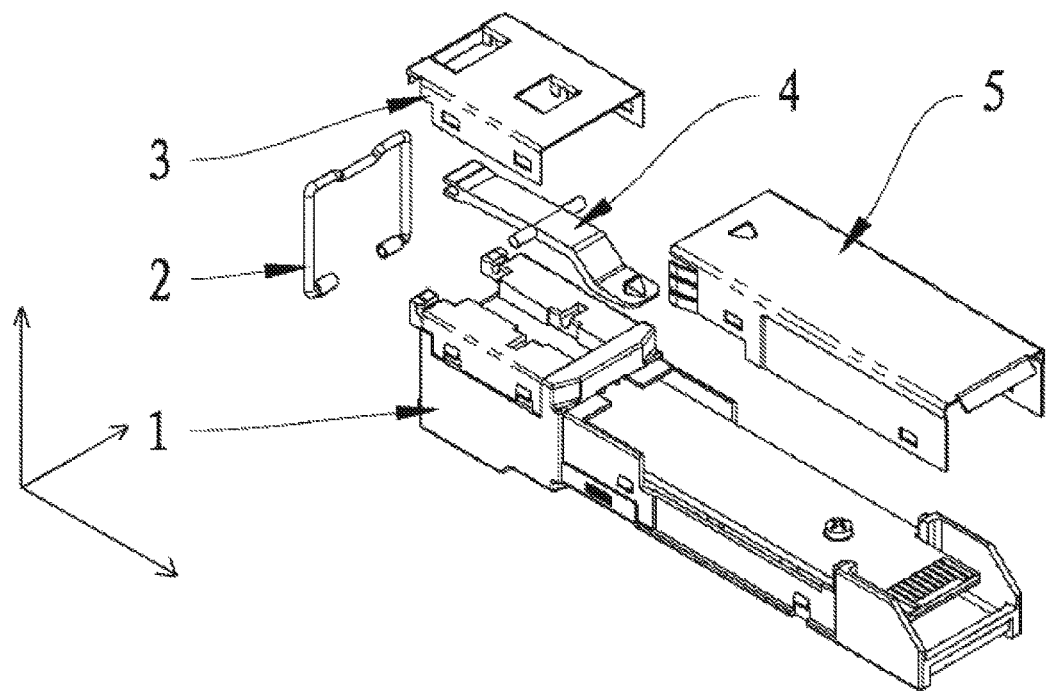
FIG. 1 is the exploded view of a mechanism for locking and unlocking a photoelectric module that is provided by an embodiment of the present invention.

wherein: 1 is the base, 1-1 the lock latch limiting slot, 1-2 the handle turning slot, 1-3 the lock latch turning slots, 1-4 the EMI shielding sheet, 1-5 the EMI clip, 1-6 the RJ45 clipping ears, 1-7 the handle clipping ears, 1-8 the PCB board, 1-9 the main tag slot, 1-10 the anti-reverse-insertion notch, 1-11 the hood position clipping tab, 1-12 the first clipping cover position clipping tab, 1-13 the second clipping cover position clipping tabs, 2 the handle, 2-1 the main body, 2-2 the handle sheath, 2-3 the first rotation shafts, 2-4 the second rotation shaft, 3 the clipping cover, 3-1 the windows, 3-2 the first position clipping square holes, 3-3 the second position clipping square holes, 3-4 the rotation shaft clamping lugs, 3-5 the edge fold, 4 the lock latch, 4-1 the handle fitting position, 4-2 the lock latch rotation shafts, 4-3 the tab, 5 the housing, 5-1 the third position clipping square hole, 5-2 the EMI sprung claw, 5-3 the unlocking tab hole, 5-4 the side tag slot, and 5-5 the EMI bent.

DETAILED DESCRIPTION OF THE INVENTION

In order to make the purposes, the technical solutions and the advantages of the present invention more clear, the present invention will be further described in detail below by referring to the drawings and the embodiments. It should be understood that, the particular embodiments described herein are merely intended to explain the present invention, but are not to limit the present invention.

The technical solutions of the present invention will be described below with reference to special embodiments.

FIG. 1 shows the exploded view of a mechanism for locking and unlocking a photoelectric module that is provided by the present invention, and it can be known from FIG. 1 that:

the mechanism for locking and unlocking a photoelectric module that is provided by an embodiment of the present invention comprises: a base 1, and a handle 2, a clipping cover 3, a lock latch 4 and a hood 5 that are placed above the base 1 and are connected to the base 1.

Figure 2:
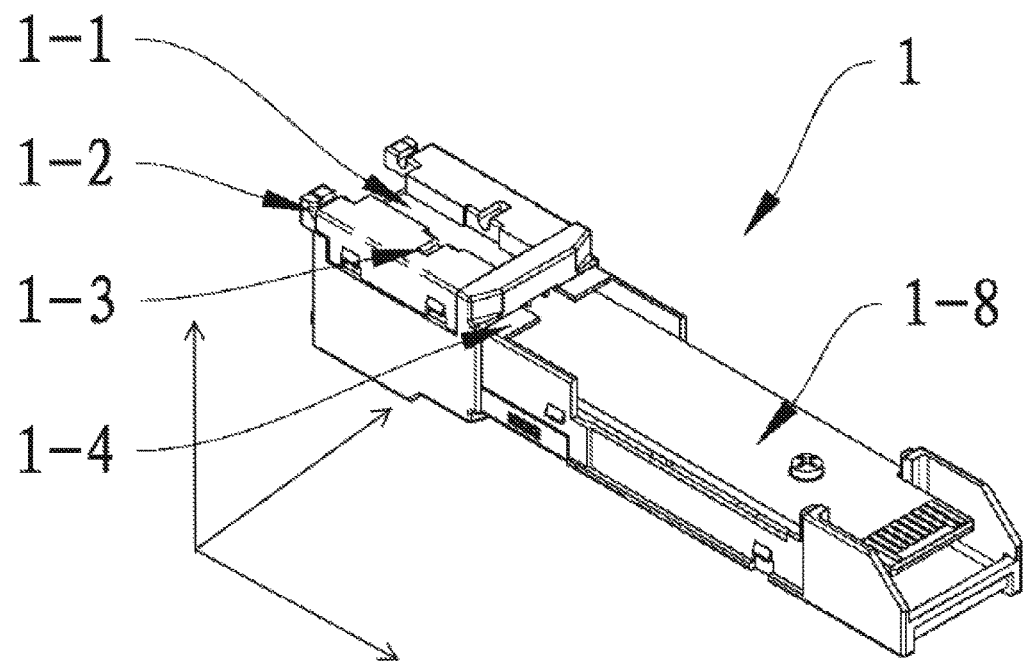
FIG. 2 is the three-dimensional schematic diagram by the first visual angle of a mechanism for locking and unlocking a photoelectric module that is provided by an embodiment of the present invention.
Figure 3:
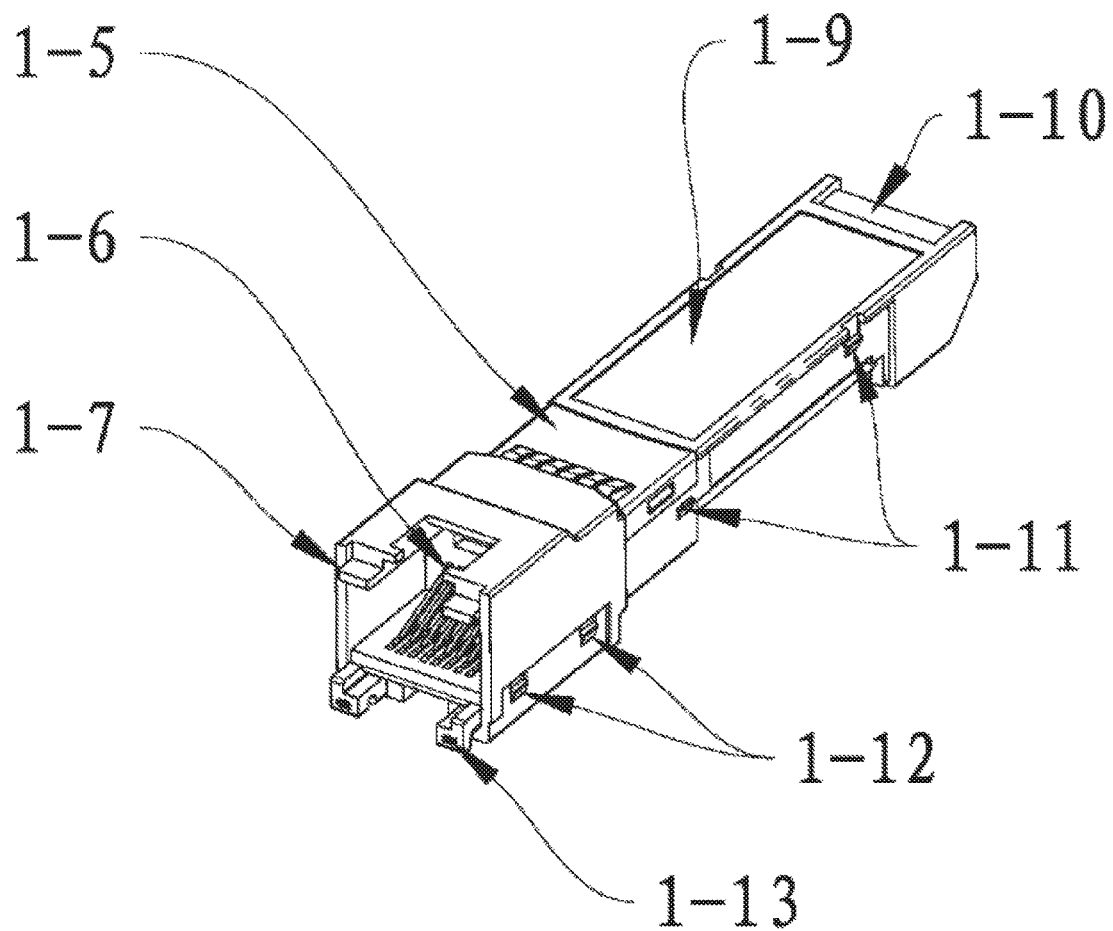
FIG. 3 is the three-dimensional schematic diagram by the second visual angle of a mechanism for locking and unlocking a photoelectric module that is provided by an embodiment of the present invention.

FIG. 2 and FIG. 3 respectively show the three-dimensional schematic diagrams by the first visual angle and the second visual angle of a mechanism for locking and unlocking a photoelectric module that is provided by an embodiment of the present invention, wherein the visual angle directions of the first visual angle and the second visual angle are opposite. The upper face that is displayed in FIG. 2 is the upper bottom face of the base 1, and the upper face that is displayed in FIG. 3 is the lower bottom face of the base 1. It can be known from FIG. 1 and FIG. 2 that:

the base 1 is of a cuboid shape with an inner cavity, the left end of the upper bottom face of the base 1 is provided with a cuboid-shaped lock latch limiting slot 1-1, and the two sides in the front and rear of the cuboid-shaped lock latch limiting slot 1-1 on the upper bottom face of the base 1 are provided with two symmetrical lock latch turning slots 1-3; and the upper end on the left side face of the base 1 is provided with a handle turning slot 1-2 whose axial direction is the front-back direction.

Figure 4:
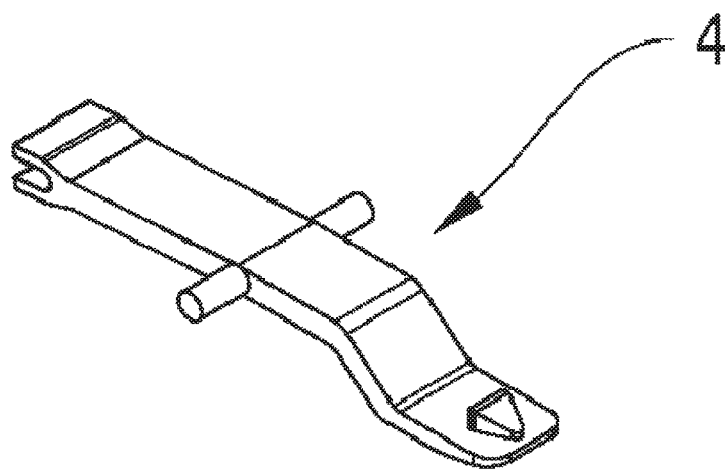
FIG. 4 is the perspective view of the lock latch of a mechanism for locking and unlocking a photoelectric module that is provided by an embodiment of the present invention.
Figure 5:
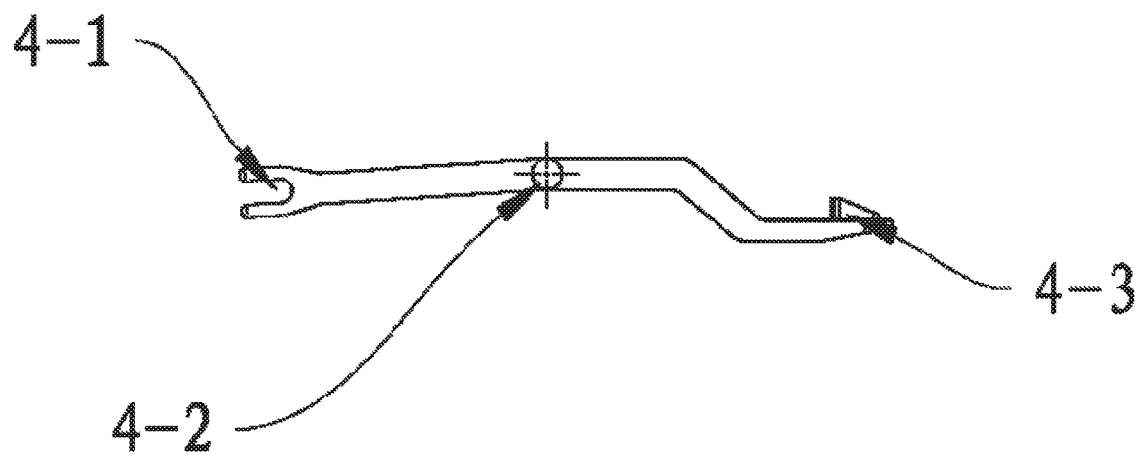
FIG. 5 is the front view of the lock latch of a mechanism for locking and unlocking a photoelectric module that is provided by an embodiment of the present invention.
Figure 6:
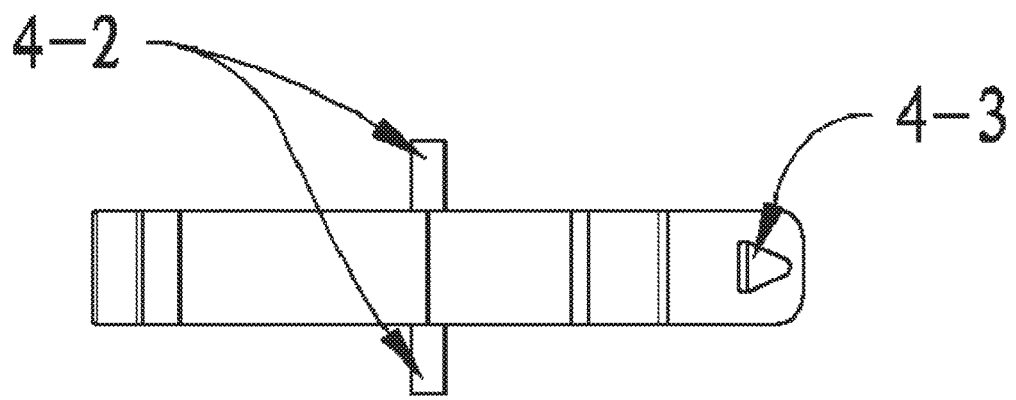
FIG. 6 is the top view of the lock latch of a mechanism for locking and unlocking a photoelectric module that is provided by an embodiment of the present invention.

FIGS. 4-6 respectively show the perspective view, the front view and the top view of the lock latch of a mechanism for locking and unlocking a photoelectric module that is provided by an embodiment of the present invention. It can be known from FIG. 4-FIG. 6 that, the lock latch 4 is an elongated-rod rigid body, wherein the left end of the lock latch 4 is a handle fitting position 4-1, the upper bottom face of the right end of the lock latch 4 is provided with a tab 4-3, and lock latch rotation shafts 4-2 are provided between the handle fitting position 4-1 and the tab 4-3 correspondingly on the front face and the rear face of the lock latch 4.

The left end of the lock latch 4 and the lock latch rotation shafts 4-2 are respectively placed within the lock latch limiting slot 1-1 and the lock latch turning slots 1-3.

Figure 7:
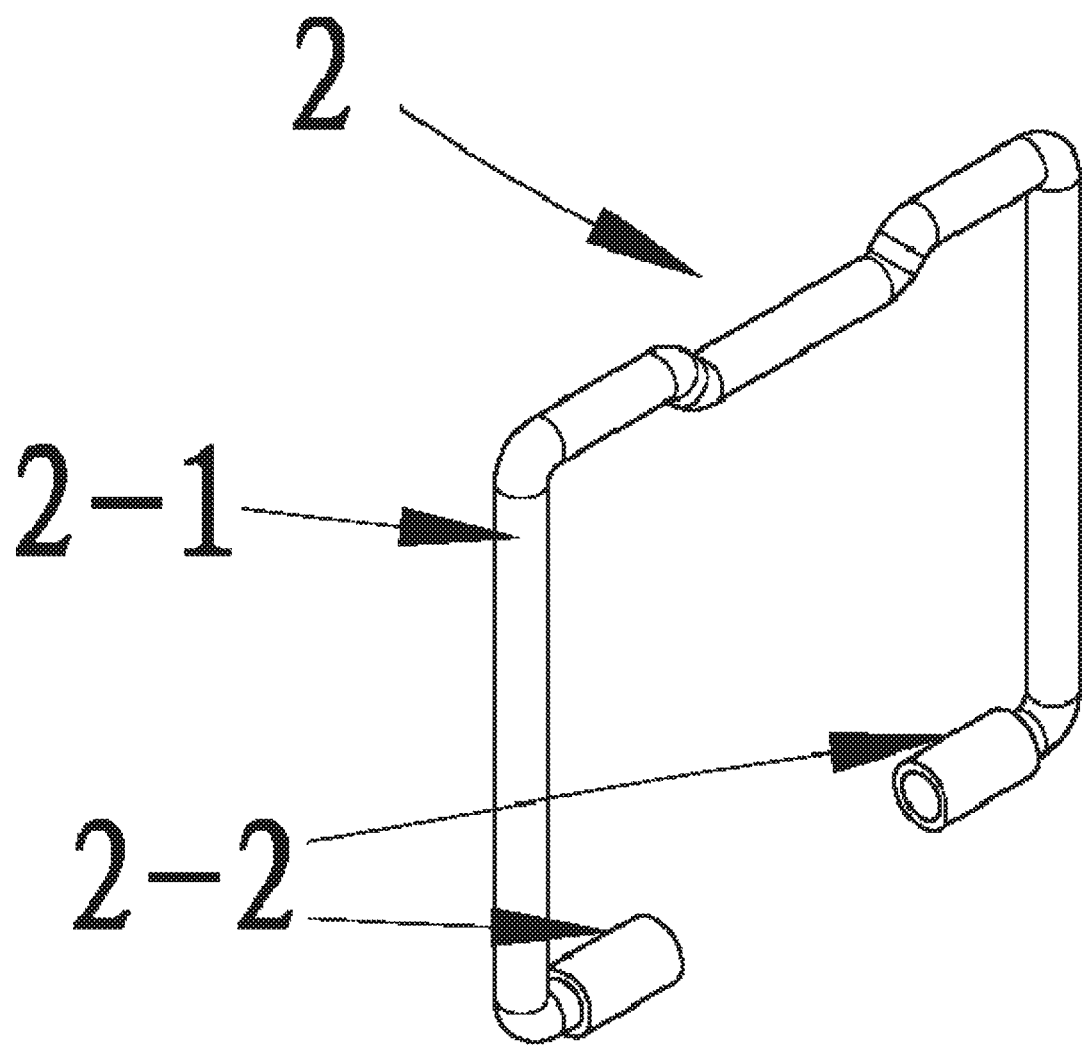
FIG. 7 is the perspective view of the handle of a mechanism for locking and unlocking a photoelectric module that is provided by an embodiment of the present invention.
Figure 8:
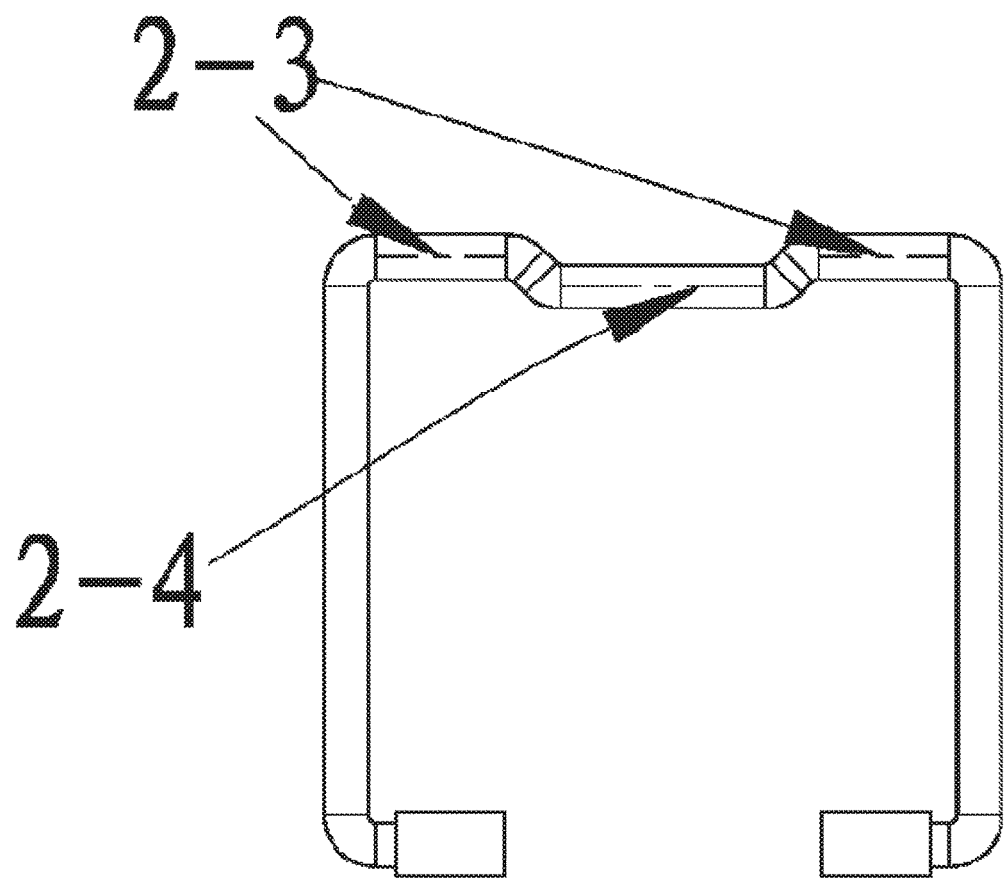
FIG. 8 is the front view of the handle of a mechanism for locking and unlocking a photoelectric module that is provided by an embodiment of the present invention.
Figure 9:
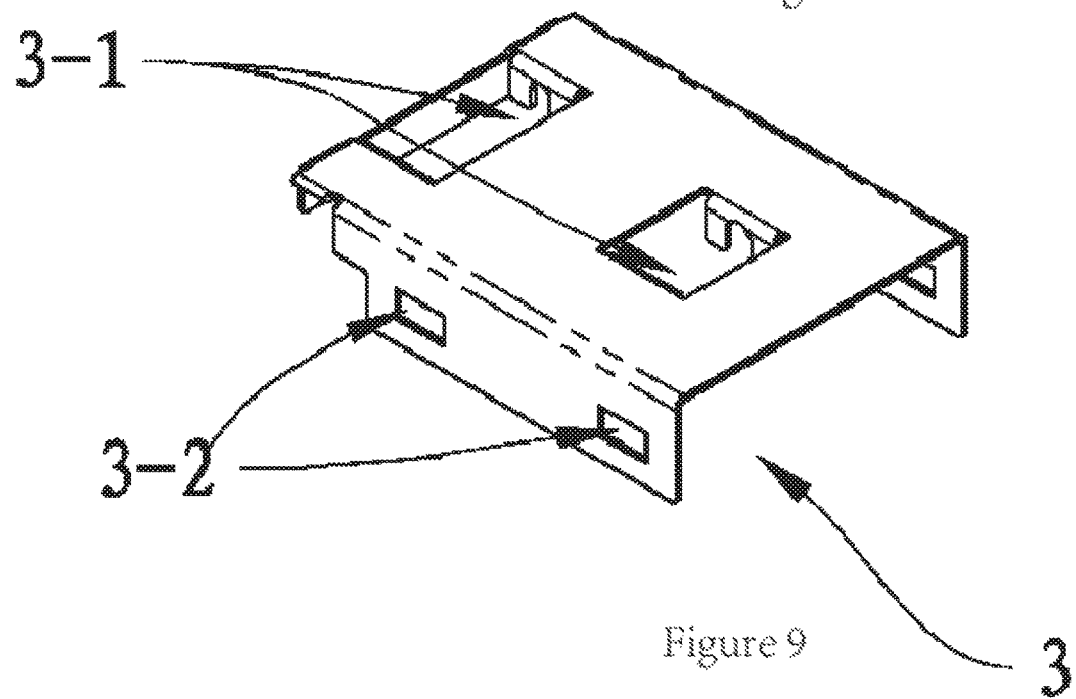
FIG. 9 is the perspective view of the clipping cover of a mechanism for locking and unlocking a photoelectric module that is provided by an embodiment of the present invention.
Figure 10:
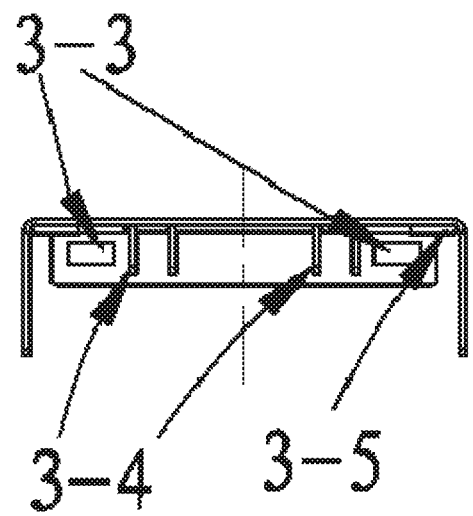
FIG. 10 is the left view of the clipping cover of a mechanism for locking and unlocking a photoelectric module that is provided by an embodiment of the present invention.
Figure 11:
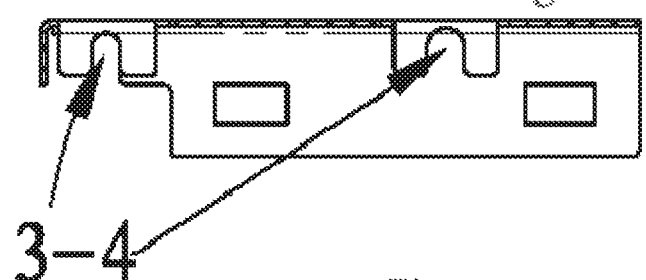
FIG. 11 is the front view of the clipping cover of a mechanism for locking and unlocking a photoelectric module that is provided by an embodiment of the present invention.
Figure 12:
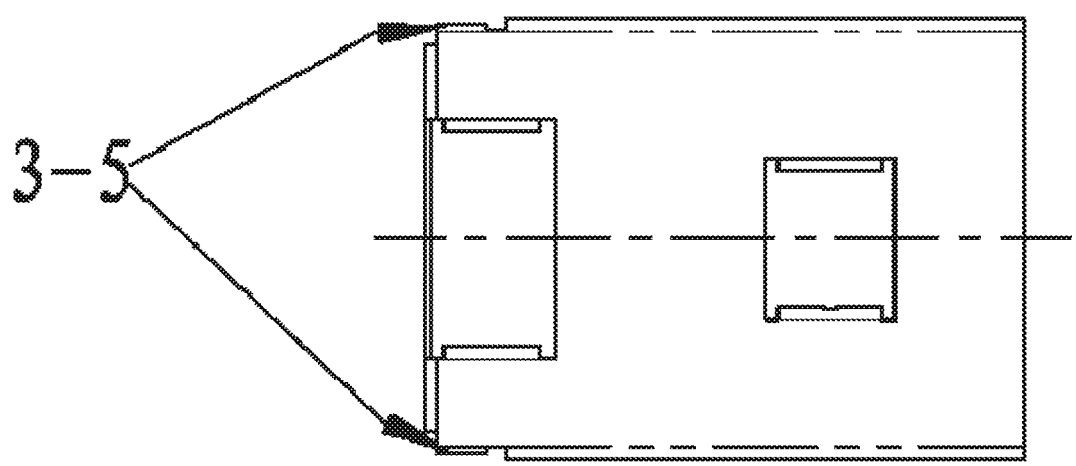
FIG. 12 is the top view of the clipping cover of a mechanism for locking and unlocking a photoelectric module that is provided by an embodiment of the present invention.
Figure 13:
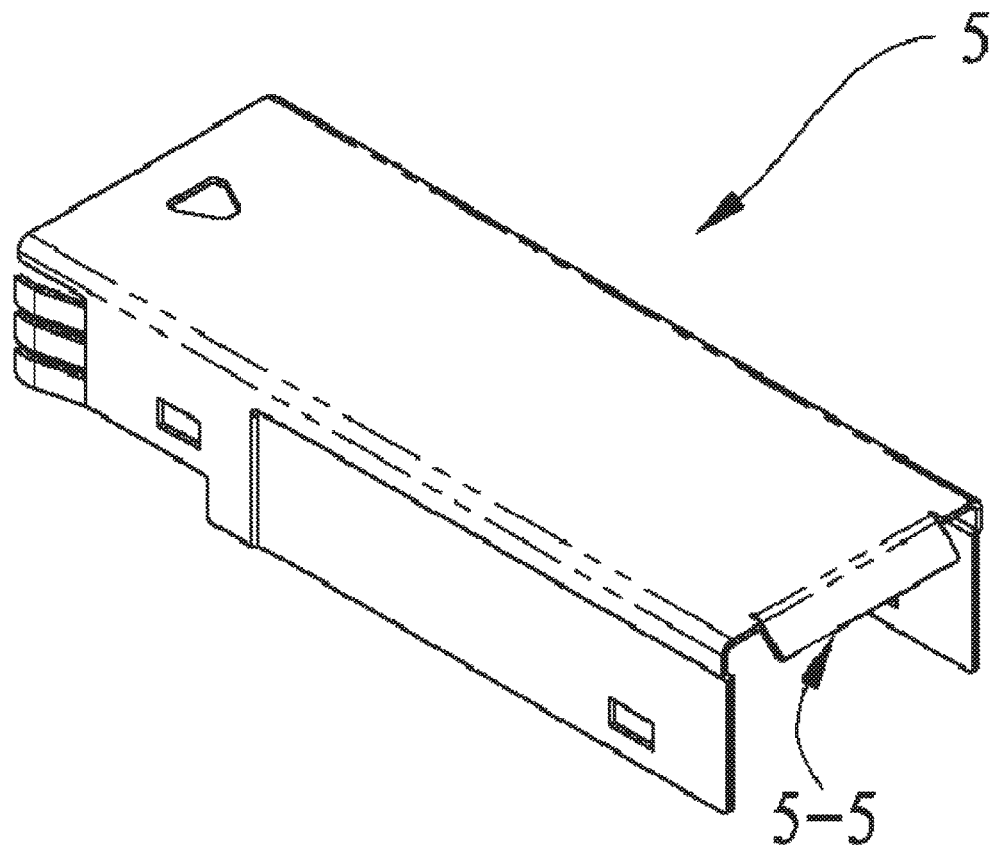
FIG. 13 is the perspective view of the hood of a mechanism for locking and unlocking a photoelectric module that is provided by an embodiment of the present invention.
Figure 14:
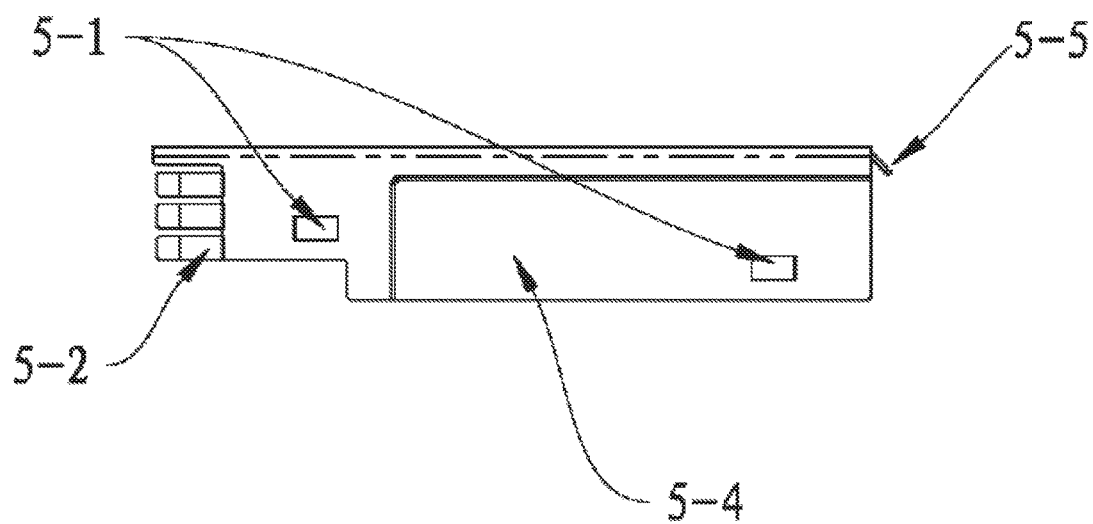
FIG. 14 is the front view of the hood of a mechanism for locking and unlocking a photoelectric module that is provided by an embodiment of the present invention.
Figure 15:
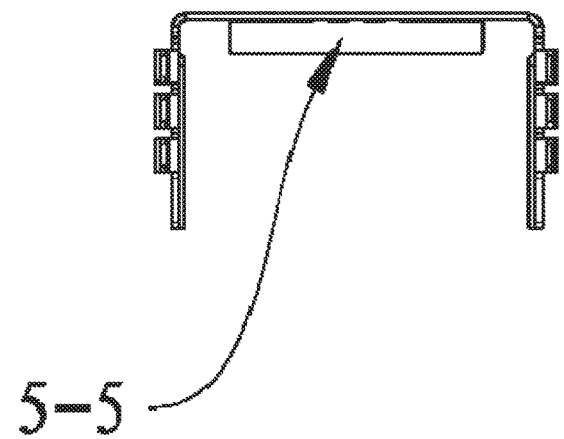
FIG. 15 is the left view of the hood of a mechanism for locking and unlocking a photoelectric module that is provided by an embodiment of the present invention.
Figure 16:
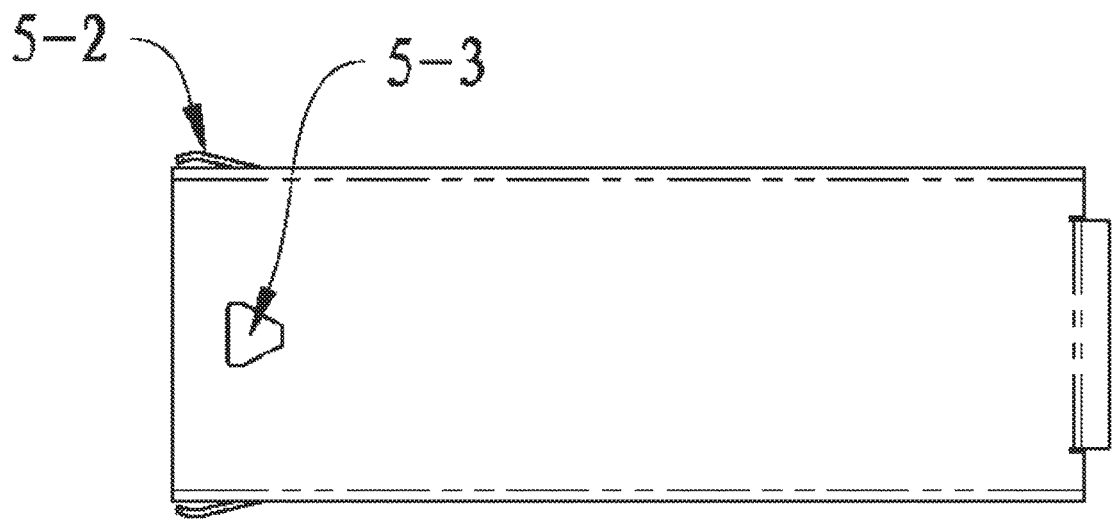
FIG. 16 is the top view of the hood of a mechanism for locking and unlocking a photoelectric module that is provided by an embodiment of the present invention.

FIGS. 7-8 respectively show the perspective view and the front view of the handle of a mechanism for locking and unlocking a photoelectric module that is provided by an embodiment of the present invention. It can be known from FIG. 7 and FIG. 8 that, the handle 2 is of a cubic frame shape having an opening or closed, and FIG. 7 and FIG. 8 give the embodiment that the cubic frame shape is provided with an opening at the bottom. In the upper border frame of the handle 2, the two ends are two symmetrical first rotation shafts 2-3, and the middle is a second rotation shaft 2-4 of a height less than those of the first rotation shafts 2-3; and the first rotation shafts 2-3 and the second rotation shaft 2-4 are respectively placed within the handle turning slot 1-2 and the handle fitting position 4-1.

FIGS. 9-12 respectively show the perspective view, the left view, the front view and the top view of the clipping cover of a mechanism for locking and unlocking a photoelectric module that is provided by an embodiment of the present invention.

It can be known from FIGS. 9-12 that, the clipping cover 3 is of a U-shape, with the opening of the U shape downward, and is provided above the handle 2 and the lock latch 4.

FIGS. 13-16 respectively show the perspective view, the front view, the left view and the top view of the hood of a mechanism for locking and unlocking a photoelectric module that is provided by an embodiment of the present invention.

It can be known from FIGS. 13-16 that, the hood 5 is of a U-shape, with the opening of the U shape downward, the hood 5 is provided to the right of the handle 2, the clipping cover 3 and the lock latch 4, the left end of the upper bottom face of the hood 5 is provided with an unlocking tab hole 5-3, and the size of the unlocking tab hole 5-3 matches the tab 4-3 of the lock latch 4.

The upper bottom face of the base 1 is further provided with a protruding shaft whose axial direction is the front-back direction, and the middle of the lock latch 4 is placed on the protruding shaft. In practice, the first rotation shafts 2-3 turn within the handle turning slot 1-2; and the second rotation shaft 2-4 turns in the axial direction of the first rotation shafts 2-3 by the driving of the first rotation shafts 2-3, and slides within the handle fitting position 4-1. When the first rotation shafts 2-3 and the second rotation shaft 2-4 turn to the position where the handle 2 is parallel to the left and right faces of the base 1 and the handle 2 is fixed to a left head of the base 1, the second rotation shaft 2-4 is located at a vertically lowest position, and drives the handle fitting position 4-1, which is connected thereto, to descend, and because the middle of the bottom of the lock latch 4 is provided with the protruding shaft, the right end of the lock latch 4 ascends, which causes the tab 4-3 to ascend into the unlocking tab hole 5-3, which makes the whole mechanism in a locking state. When the first rotation shafts 2-3 and the second rotation shaft 2-4 turn to the position where the plane where the handle 2 is located is adjacent to the upper bottom face of the base 1, the second rotation shaft 2-4 is located at a vertically highest position, and drives the handle fitting position 4-1, which is connected thereto, to ascend and the right end of the lock latch 4 to descend, which causes the tab 4-3 to descend to be below the unlocking tab hole 5-3, which makes the whole mechanism in an unlocking state.

Specially, when the mechanism for locking and unlocking a photoelectric module is currently in the locking state and needs to be unlocked, turning clockwise the lock latch to the position where the plane where the lock latch is located is adjacent to the upper bottom face of the base, in practice when the angle between the plane where the lock latch is located and the upper bottom face of the base is less than 10°, can complete the unlocking of the photoelectric module.

The mechanism for locking and unlocking a photoelectric module that is provided by an embodiment of the present invention has an exquisite structural design, by which the profile of the module meets the requirements on the size by MSA, and additionally the problems of restricted internal room of the tube shell and complicated tube shell installation procedure are solved. Additionally, the actions of the locking and unlocking of the module in metal shielding cages of photoelectric communication systems can be realized conveniently and quickly. The locking and unlocking mechanism of the present invention can be conveniently and flexibly assembled and disassembled.

Figure 17:
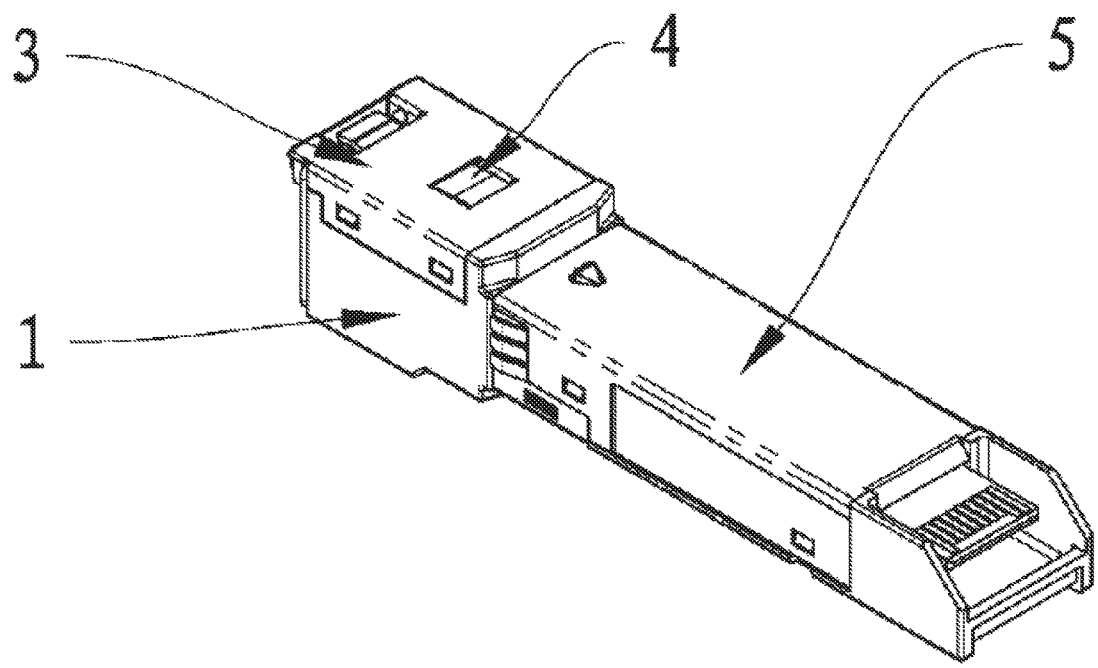
FIG. 17 is the perspective view of a mechanism for locking and unlocking a photoelectric module that is provided by an embodiment of the present invention when it has been completely assembled.
Figure 18:
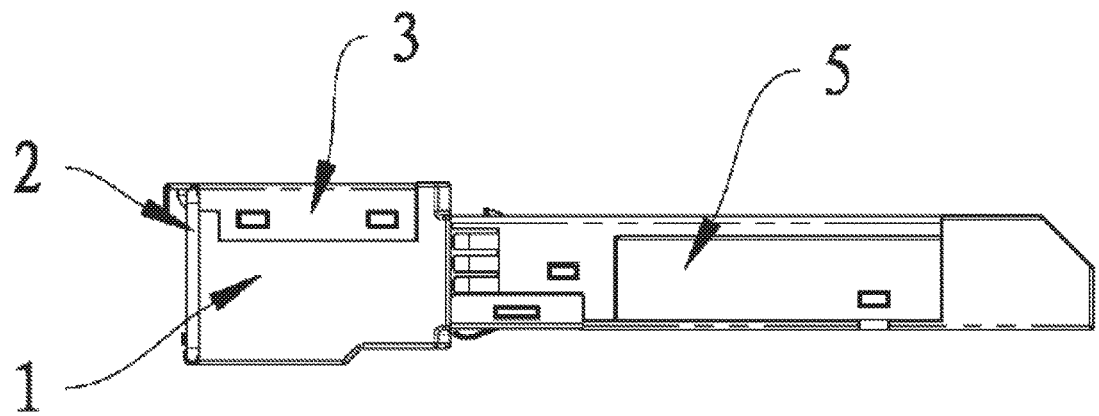
FIG. 18 is the front view of a mechanism for locking and unlocking a photoelectric module that is provided by an embodiment of the present invention when it has been completely assembled.

FIG. 17 and FIG. 18 are the perspective view and the front view of a mechanism for locking and unlocking a photoelectric module that is provided by an embodiment of the present invention when it has been completely assembled.

Further, both of the front face and the rear face of the base 1 are provided with a hood position clipping tab 1-11 and a first clipping cover position clipping tab 1-12. The numbers of the hood position clipping tab 1-11 and the first clipping cover position clipping tab 1-12 are both at least a pair, which are provided in the front face and the rear face of the base 1 correspondingly in pairs.

A pair of handle turning slots 1-2 at the upper end of the left side face of the base 1 extend outwardly to form a pair of symmetrical second clipping cover position clipping tabs 1-13.

The left side face of the clipping cover 3 is provided with a pair of second position clipping square holes 3-3 that are provided correspondingly to the second clipping cover position clipping tabs 1-13, and the second position clipping square holes 3-3 are clipped to the second clipping cover position clipping tabs 1-13, to achieve the further fixing and positioning between the clipping cover 3 and the left side face of the base 1.

The front face and the rear face of the hood 5 are correspondingly provided with at least a pair of third position clipping square holes 5-1, and the third position clipping square holes 5-1 are clipped to the hood position clipping tab 1-11 of the base 1 to realize the fixing between the hood 5 and the base 1.

In the embodiments that are provided by the drawings of the description of the present invention, the numbers of the hood position clipping tab 1-11, the first clipping cover position clipping tab 1-12, the first position clipping square holes 3-2 and the third position clipping square holes 5-1, which are used for fixing the clipping cover 3 and the hood 5 to the base 1, are all two pairs, which are correspondingly provided on the front faces and the rear faces of the base 1, the clipping cover 3 and the hood 5.

The middle of the lower bottom face of the base 1 is provided with an EMI clip 1-5, the right side is a main tag slot 1-9, and the left side is provided with RJ45 clipping ears 1-6 that are provided correspondingly in the front-back direction; and the middle of the upper bottom face is provided with an EMI shielding sheet 1-4, and the right side is a PCB board 1-8.

The lower end of the left side face of the base 1 is provided with a pair of protruding handle clipping ears 1-7, which are used for, when the first rotation shafts 2-3 and the second rotation shaft 2-4 turn to the position where the handle 2 is parallel to the left and right faces of the base 1 and the handle 2 is fixed to the left head of the base 1, conveniently fixing the handle 2.

The lower end of the right side face of the lower bottom face of the base 1 is provided with an anti-reverse-insertion notch 1-10.

The handle fitting position 4-1 is of an opening U shape or a closed elliptical ring shape, to cause the second rotation shaft 2-4, when driven by the first rotation shafts 2-3 to turn, to slide within the horizontal space within the handle fitting position 4-1. The tab 4-3 is a triangular or square tab.

The handle 2 further comprises an opening or closed type handle main body 2-1 and handle sheath 2-2 that are made from a rigid or semi-rigid material, the first rotation shafts 2-3, the second rotation shaft 2-4 and the handle sheath 2-2 are all provided on the outside of the handle main body 2-1, and the handle sheath 2-2 are located at the two ends of the opening of the opening type handle main body 2-1.

The upper bottom face, the left end and the middle of the clipping cover 3 are all provided with a window 3-1, rotation shaft clamping lugs 3-4 are provided below the two sides of the windows 3-1 whose axial directions are the left-right direction, and the rotation shaft clamping lugs 3-4 conduct limiting clipping to the first rotation shafts 2-3 of the handle 2 and the lock latch rotation shafts 4-2 of the lock latch 4 and the handle turning slots 1-2 and the lock latch turning slots 1-3 of the base 1.

Both of the left ends of the front face and the rear face of the clipping cover 3 are provided with edge folds 3-5 that are formed by bending the upper bottom face, and in the process of turning the handle 2 to move the mechanism from the locking state to the unlocking state, the handle 2 approaches the edge fold 3-5 and is stopped, which enables the turning of the handle 2 not to exceed a preset turning angle.

Both of the front face and the rear face of the left end of the hood 5 are provided with an EMI sprung claw 5-2, and the right end of the upper bottom face of the hood 5 is bent obliquely downwardly to form an EMI bent 5-5.

The front face or the rear face of the hood 5 is further provided with a side tag slot 5-4.

The above description is merely preferable embodiments of the present invention, and is not indented to limit the present invention. Any modifications, equivalent substitutions and improvements that are made within the spirit and principle of the present invention should fall within the protection scope of the present invention.

What is claimed is:

1. A mechanism for locking and unlocking a photoelectric module, wherein, the mechanism comprises:
    a base, and a handle, a clipping cover, a lock latch and a hood that are placed above the base and are connected to the base;
    the base is of a cuboid shape with an inner cavity, a left end of an upper face of the base is provided with a cuboid-shaped lock latch limiting slot, and two sides in front and rear of the lock latch limiting slot on the upper bottom face of the base are provided with two symmetrical lock latch turning slots;
    an upper end on a left side face of the base is provided with a handle turning slot whose axial direction is a front-back direction;
    the lock latch is an elongated-rod rigid body, wherein a left end of the lock latch is a handle fitting position, an upper bottom face of a right end of the lock latch is provided with a tab, and lock latch rotation shafts are provided between the handle fitting position and the tab correspondingly on a left face and a right face of the lock latch;
    the left end of the lock latch and the lock latch rotation shafts are respectively placed within the lock latch limiting slot and the lock latch turning slots;
    the handle is of a cubic frame shape having an opening or closed loop, and in an upper border frame of the handle, two ends are two symmetrical first rotation shafts, and a middle is a second rotation shaft of a height less than those of the first rotation shafts; and the first rotation shafts and the second rotation shaft are respectively placed within the handle turning slot and the handle fitting position;
    the clipping cover is of a U-shape, with the opening of the U shape downward, and is provided above the handle and the lock latch; and
    the hood is of a U-shape, with the opening of the U shape downward, the hood is provided to the right of the handle, the clipping cover and the lock latch, a left end of an upper bottom face of the hood is provided with an unlocking tab hole, and a size of the unlocking tab hole matches the tab of the lock latch, wherein, both of a front face and a rear face of the base are provided with a hood position clipping tab and a first clipping cover position clipping tab; the numbers of the hood position clipping tab and the first clipping cover position clipping tab are both at least a pair, which are provided in the front face and the rear face of the base correspondingly in pairs; and the pair of handle turning slots at the upper end of the left side face of the base extend outwardly to form a pair of symmetrical second clipping cover position clipping tabs;
    a front face and a rear face of the clipping cover are correspondingly provided with at least a pair of first position clipping square holes, and the first position clipping square holes are clipped to the first clipping cover position clipping tab of the base; and a left side face of the clipping cover is provided with a pair of second position clipping square holes that are provided correspondingly to the second clipping cover position clipping tabs, and the second position clipping square holes are clipped to the second clipping cover position clipping tabs;
    after the lock latch and the handle are fixedly connected to the base-, the clipping cover is placed at an upper parts of the lock latch and the handle and is fixed to the base by the first position clipping square holes and the second position clipping square holes; and
    a front face and a rear face of the hood are correspondingly provided with at least a pair of third position clipping square holes, and the third position clipping square holes are clipped to the hood position clipping tab of the base to realize the fixing between the hood and the base.

2. The mechanism according to claim 1, wherein, the upper bottom face of the base is provided with the two symmetrical lock latch turning slots whose axial direction is the front-back direction;
    the first rotation shafts turn within the handle turning slot; and the second rotation shaft turns in the axial direction of the first rotation shafts by the driving of the first rotation shafts, and slides within the handle fitting position;
    when the first rotation shafts and the second rotation shaft turn to the position where the handle is parallel to left and right faces of the base and the handle is fixed to a left head of the base, the second rotation shaft is located at a vertically lowest position, and drives the handle fitting position, which is connected thereto, to descend and the right end of the lock latch to ascend, which causes the tab to ascend into the unlocking tab hole, which makes the whole mechanism in a locking state; and
    when the first rotation shafts and the second rotation shaft turn to the position where the plane where the handle is located is adjacent to the upper bottom face of the base, the second rotation shaft is located at a vertically highest position, and drives the handle fitting position, which is connected thereto, to ascend, and the right end of the lock latch to descend, which causes the tab to descend to be below the unlocking tab hole, which makes the whole mechanism in an unlocking state.

3. The mechanism according to claim 1, wherein, a middle of a lower bottom face of the base is provided with an EMI clip, a right side is a main tag slot, and a left side is provided with RJ45 clipping ears that are provided correspondingly in a front-back direction; and a middle of the upper bottom face is provided with an EMI shielding sheet, and a right side is a PCB board;
    a lower end of the left side face of the base is provided with a pair of protruding handle clipping ears, which are used for, when the first rotation shafts and the second rotation shaft turn to the position where the handle is parallel to left and right faces of the base and the handle is fixed to a left head of the base, fixing the handle; and a lower end of a right side face of the base is provided with an anti-reverse-insertion notch.

4. The mechanism according to claim 1, wherein, the handle fitting position is of an opening U shape or a closed elliptical ring shape, and the tab is a triangular or square tab.

5. The mechanism according to claim 1, wherein, the handle further comprises an opening or closed type handle main body and handle sheath that are made from a rigid or semi-rigid material, the first rotation shafts, the second rotation shaft and the handle sheath are all provided on an outside of the handle main body, and the handle sheath are located at the two ends of the opening of the opening or closed type handle main body.

6. The mechanism according to claim 1, wherein, an upper bottom face, a left end and a middle of the clipping cover are all provided with a window, rotation shaft clamping lugs are provided below the two sides of the windows whose axial directions are the front-back direction, and the rotation shaft clamping lugs conduct limiting clipping to the first rotation shafts of the handle and the lock latch rotation shafts of the lock latch and the handle turning slot and the lock latch turning slots of the base.

7. The mechanism according to claim 1, wherein, both of left ends of a front face and a rear face of the clipping cover are provided with edge folds that are formed by bending the upper bottom face, and in the process of turning the handle to move the mechanism from the locking state to the unlocking state, the handle approaches the edge fold and is stopped, which enables the turning of the handle not to exceed a preset turning angle.

8. The mechanism according to claim 1, wherein, both of a front face and a rear face of a left end of the hood are provided with an EMI sprung claw, and a right end of the upper bottom face of the hood is bent obliquely downwardly to form an EMI bent; and a front face or a rear face of the hood is further provided with a side tag slot.

* * * * *